(12) United States Patent
Xiao et al.

(10) Patent No.: US 11,428,976 B2
(45) Date of Patent: Aug. 30, 2022

(54) DISPLAY DEVICE AND ELECTRONIC DEVICE

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Jun Xiao, Beijing (CN); Wei Huang, Beijing (CN)

(73) Assignees: K-Tronics (Suzhou) Technology Co., Ltd., Jiangsu (CN); BOE Technology Group Co., Ltd., Beijing (CN)

( * ) Notice: Subject to any disclaimer, the term of this patent is extended or adjusted under 35 U.S.C. 154(b) by 175 days.

(21) Appl. No.: 16/767,305

(22) PCT Filed: Jun. 13, 2019

(86) PCT No.: PCT/CN2019/091141
§ 371 (c)(1),
(2) Date: May 27, 2020

(87) PCT Pub. No.: WO2020/248195
PCT Pub. Date: Dec. 17, 2020

(65) Prior Publication Data
US 2021/0405435 A1 Dec. 30, 2021

(51) Int. Cl.
*G02F 1/1333* (2006.01)
*H05K 7/20* (2006.01)

(52) U.S. Cl.
CPC .. *G02F 1/133385* (2013.01); *G02F 1/133314* (2021.01); *G02F 1/133342* (2021.01); *G02F 1/133391* (2021.01); *H05K 7/20* (2013.01)

(58) Field of Classification Search
None
See application file for complete search history.

(56) References Cited

U.S. PATENT DOCUMENTS

2004/0264130 A1 12/2004 Liang
2009/0009974 A1* 1/2009 Tseng ................ G02F 1/133382
361/711

FOREIGN PATENT DOCUMENTS

| CN | 203117610 U | 8/2013 |
| CN | 205809470 U | 12/2016 |
| CN | 206594972 U | 10/2017 |
| CN | 109448577 A | 3/2019 |

* cited by examiner

*Primary Examiner* — Richard H Kim
(74) *Attorney, Agent, or Firm* — The Webb Law Firm (57) ABSTRACT

The present disclosure relates to a display device and an electronic device. The display device includes: a first display module having a first backplane; a second display module having a second backplane located on an opposite side of the first backplane; and a first heat sink located between the first backplane and the second backplane, and configured to radiate heat from the first backplane and the second backplane.

16 Claims, 6 Drawing Sheets

DISPLAY DEVICE AND ELECTRONIC DEVICE

CROSS-REFERENCE TO RELATED APPLICATION

This application is the United States national phase of International Application No. PCT/CN2019/091141 filed Jun. 13, 2019, the disclosure of which is hereby incorporated in its entirety by reference.

TECHNICAL FIELD

The present disclosure relates to a display device and an electronic device.

BACKGROUND

During the operation process of the outdoor display device, the heat produced by the display module for use in the display device cannot be effectively emitted, which might reduce the service life of the display device.

SUMMARY

In one aspect of the present disclosure, a display device is provided. The display device includes: a first display module having a first backplane; a second display module having a second backplane located on an opposite side of the first backplane; and a first heat sink located between the first backplane and the second backplane, and configured to radiate heat from the first backplane and the second backplane.

In some embodiments, the first heat sink includes one elongated member or a plurality of elongated members; one first elongated groove for accommodating the one elongated member is provided on one side of the first backplane adjacent to the second backplane; one second elongated groove for accommodating the one elongated member is provided on one side of the second backplane adjacent to the first backplane; the one elongated member is disposed in at least one of the one first elongated groove and the one second elongated groove; or a plurality of first elongated grooves for accommodating a plurality of elongated members are provided on one side of the first backplane adjacent to the second backplane; a plurality of second elongated grooves for accommodating the plurality of elongated members are provided on one side of the second backplane adjacent to the first backplane; the plurality of elongated members are respectively disposed in the plurality of first elongated grooves and the plurality of second elongated grooves.

In some embodiments, the one first elongated groove is disposed opposite to the one second elongated groove, so as to enclose one accommodating cavity in which the one elongated member is located.

In some embodiments, the plurality of first elongated grooves are disposed opposite to the plurality of second elongated grooves, so as to enclose a plurality of accommodating cavities, and the plurality of elongated members are respectively located in a part or all of the plurality of accommodating cavities.

In some embodiments, the plurality of first elongated grooves include a plurality of first linear grooves, and the plurality of second elongated grooves include a plurality of second linear grooves one-to-one correspondence with the plurality of first linear grooves, so as to enclose a plurality of linear accommodating cavities with the plurality of first linear grooves, and each of the plurality of elongated members has a linear rod section respectively located in the plurality of linear accommodating cavities.

In some embodiments, the plurality of first linear grooves are parallel to each other with a same interval, and the plurality of second linear grooves are parallel to each other with a same interval.

In some embodiments, each of the first backplane and the second backplane has four side end surfaces, and an inner surface and an outer surface which are located between the four side end surfaces and oppositely arranged, the four side end surfaces include a first side end surface and a second side end surface respectively corresponding to a sky side and a ground side of the display device, the plurality of first linear grooves are located in an outer surface of the first backplane, and extend from a first side end surface of the first backplane to a second side end surface of the first backplane, and the plurality of second linear grooves are located in an outer surface of the second backplane, and extend from a first side end surface of the second backplane to a second side end surface of the second backplane, and linear rod sections of the plurality of elongated members extend from the first side end surface of the second backplane to the second side end surface of the second backplane.

In some embodiments, each of the plurality of first linear grooves and each of the plurality of second linear grooves have an inner cross-section which is a part of a circle or a part of an ellipse, and the linear rod sections have an outer cross-section which is a circle or an ellipse.

In some embodiments, each of the plurality of first linear grooves and each of the plurality of second linear grooves have an inner cross-section which is a semi-circle having an equal radius, and the linear rod sections have an outer cross-section which is a circle having the same radius as the semi-circle.

In some embodiments, the elongated member includes a heat pipe.

In some embodiments, the heat pipe includes a gravity heat pipe with a wall material of metal.

In some embodiments, the gravity heat pipe has a wall material of copper.

In some embodiments, each of the plurality of elongated members has an extension section extending to an exterior of the first backplane and the second backplane, and the display device further includes: a second heat sink located on one side of the first display module and the second display module adjacent to the extension section, and connected to the extension section in thermal conduction.

In some embodiments, the second heat sink includes a plurality of thermoelectric coolers; the display device further includes: a fixing base located between the plurality of thermoelectric coolers and the extension section, and configured to fixedly connect the second heat sink to the plurality of elongated members.

In some embodiments, the fixing base includes: a base having a plurality of plugging holes and a plurality of limiting slots respectively communicating with the plurality of plugging holes inside the base; and a cover plate located between the base and the plurality of thermoelectric coolers, and fixedly connected to the plurality of thermoelectric coolers and the base; wherein extension sections of the plurality of elongated members respectively pass through the plurality of plugging holes, and are bent and embedded in the plurality of limiting slots, and an inner surface of the cover plate is configured to fix bent portions of the extension sections of the plurality of elongated members in abutting manner.

In some embodiments, the base has a first end continuously abutting an edge of at least one of the first backplane and the second backplane and a second end fixedly connected to the cover plate, the plurality of limiting slots are located at the second end of the base, the plurality of plugging holes are located at the first end of the base, a width of the first end of the base is less than that of the second end of the base in a direction perpendicular to the first backplane; an inner surface of the cover plate is closely attached to a surface of the second end of the base, and an orthographic projection of the cover plate is coincident with the surface of the second end of the base.

In some embodiments, a surface of the first end of the base is parallel to the inner surface of the cover plate, and the surface of the second end of the base is parallel to the inner surface of the cover plate.

In some embodiments, the plurality of elongated members include a plurality of elongated member groups sequentially arranged along a first direction perpendicular to linear rod sections of the plurality of elongated members, each of the elongated member groups includes a first elongated member and a second elongated member arranged adjacently along the first direction, and a bent portion of an extension section of the first elongated member is perpendicular relative to a linear rod section of the first elongated member and extends in a direction defining an acute angle with the first backplane, and a bent portion of an extension section of the second elongated member is perpendicular relative to a linear rod section of the second elongated member, and extends in a direction opposite to the extension direction of the bent portion of the extension section of the first elongated member; the plurality of limiting slots includes a plurality of limiting slot groups arranged sequentially along the first direction, and each of the limiting slot groups includes a first limiting slot and a second limiting slot arranged adjacently along the first direction, an inner contour of the first limiting slot matches an outer contour of the bent portion of the extension section of the first elongated member, an inner contour of the second limiting slot matches an outer contour of the bent portion of the extension section of the second elongated member, and orthographic projections of the first limiting slot and the second limiting slot in an extension plane of the first backplane at least partially coincide with each other.

In some embodiments, all of the bent portion of the extension section of the first elongated member and the second elongated member in each elongated member group are parallel.

In some embodiments, the display device further includes: a plurality of third heat sinks respectively connected to the plurality of thermoelectric coolers, and configured to assist the plurality of thermoelectric coolers to radiate heat.

In some embodiments, a third heat sink includes: a first fan disposed on a thermoelectric cooler, wherein an air inlet end of the first fan is located on one side of the first fan adjacent to an outer surface of the thermoelectric cooler on a sky side, an air outlet end of the first fan is located on one side of the first fan away from an outer surface of the thermoelectric cooler on a sky side, and configured for air-cooling the thermoelectric cooler.

In one aspect of the present disclosure, an electronic device is provided. The electronic device includes the display device described above.

In one aspect of the present disclosure, an electronic device is provided. The electronic device includes the display device described above.

In some embodiments, the electronic device further includes: a device housing enclosed outside the display device; and a second fan disposed within the device housing and located on a ground side of a first display module and a second display module of the display device; wherein a second heat sink of the display device is located on a sky side of the first display module and the second display module.

In some embodiments, a transparent window is provided at a position of a side wall of the device housing corresponding to the first display module and the second display module of the display device, and a ventilation gap between the transparent window and the first display module of the display device is equal to a ventilation gap between the transparent window and the second display module of the display device.

In some embodiments, the device housing further includes: one air inlet opened on a side wall of the device housing on the same side as a transparent window corresponding to one of the first display module and the second display module, and located on a ground side of the second fan; and a first air outlet and a second air outlet respectively opened on a first side wall and a second side wall of the device housing opposite and parallel to each other, and located on a sky side of the first display module and the second display module, wherein the first side wall is on the same side as a transparent window corresponding to the first display module, and the second side wall is on the same side as a transparent window corresponding to the second display module; wherein an end of the second heat sink located on a sky side is not higher than the lowest positions of the first air outlet and the second air outlet on a ground side respectively.

In some embodiments, the electronic device further includes: a first air deflector and a second air deflector disposed within the device housing and located on insides of the first air outlet and the second air outlet respectively, and both located on a sky side of the second heat sink, for guiding an air flow within the device housing to be exhausted outward through the first air outlet and the second air outlet respectively; wherein a first end of the first air deflector located on a sky side is connected to an inner wall surface of the first side wall, a first end of the first air deflector is higher than the highest position of the first air outlet on a sky side, and a second end of the first air deflector on a ground side is disposed at a center position between the first side wall and the second side wall; a first end of the second air deflector located on a sky side is connected to an inner wall surface of the second side wall, a first end of the second air deflector is higher than the highest position of the second air deflector on a sky side, and a second end of the second air deflector located on a ground side is disposed at the center position between the first side wall and the second side wall.

In one aspect of the present disclosure, a display device is provided. The display device including: a first display module having a first backplane, wherein the first backplane has a plurality of first linear grooves; a plurality of elongated members located on an outer surface of the first backplane away from the first display module on a display side, and having linear rod sections; wherein the linear rod sections of the plurality of elongated members are respectively located within a part or all of the plurality of first linear grooves.

In some embodiments, the first backplane has four side end surfaces, the outer surface between the four side end surfaces, and an inner surface disposed opposite to the outer surface, the four side end surfaces include a first side end surface and a second side end surface respectively corresponding to a sky side and a ground side of the display device, the plurality of first linear grooves are parallel to each other with a same interval, and extend from a first side end surface of the first backplane to a second side end surface of the first backplane, and the linear rod sections of the plurality of elongated members extend from the first side end surface of the first backplane to the second side end surface of the first backplane.

In some embodiments, each of the plurality of first linear grooves has an inner cross-section which is a semicircle having an equal radius, and the linear rod sections of the plurality of elongated members have an outer cross-section which is a circle having the same radius as the semi-circle.

In some embodiments, each of the plurality of elongated members includes a gravity heat pipe having a wall material of copper.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise/include", "have" or variants thereof means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

When the ambient temperature of the display device is high (e.g., hot weather in summer), the outdoor temperature might reach 40° or more, and the surface temperature of the display module may rise rapidly under direct sunlight. In addition, the backplanes of some display module are adjacent to a light source assembly with a high heat radiation, which may result in an excessively high internal temperature of the display module during use for a long time, thereby affecting the service life of the components.

In view of this, the embodiments of the present disclosure provide a display device and an electronic device, which can improve the heat radiation effect of the display module.

The display device provided in the embodiments of the present application may include a single-sided display screen (i.e., a display screen that displays in a single direction, hereinafter referred to as a single screen for short) or a double-sided display screen (i.e., a display screen that displays in two opposite directions, hereinafter referred to as a double screen for short). The single screen may be a single display screen, or may include a spliced screen obtained by adjacently splicing a plurality of display screens along a plane perpendicular to a display direction of the display screen. Either display screen in the double screen may be a single display screen, or may include a spliced screen obtained by splicing a plurality of screens. In the present disclosure, the display screen is also referred to as a display module, and the double screen is a combination of two display modules. The display screen is not limited to a particular type, but may be a liquid crystal display screen, an organic light emitting diode display screen or a quantum dot display screen.

Next, the embodiments of the display device of the present disclosure will be described with a double screen as an example.

Figure 1:
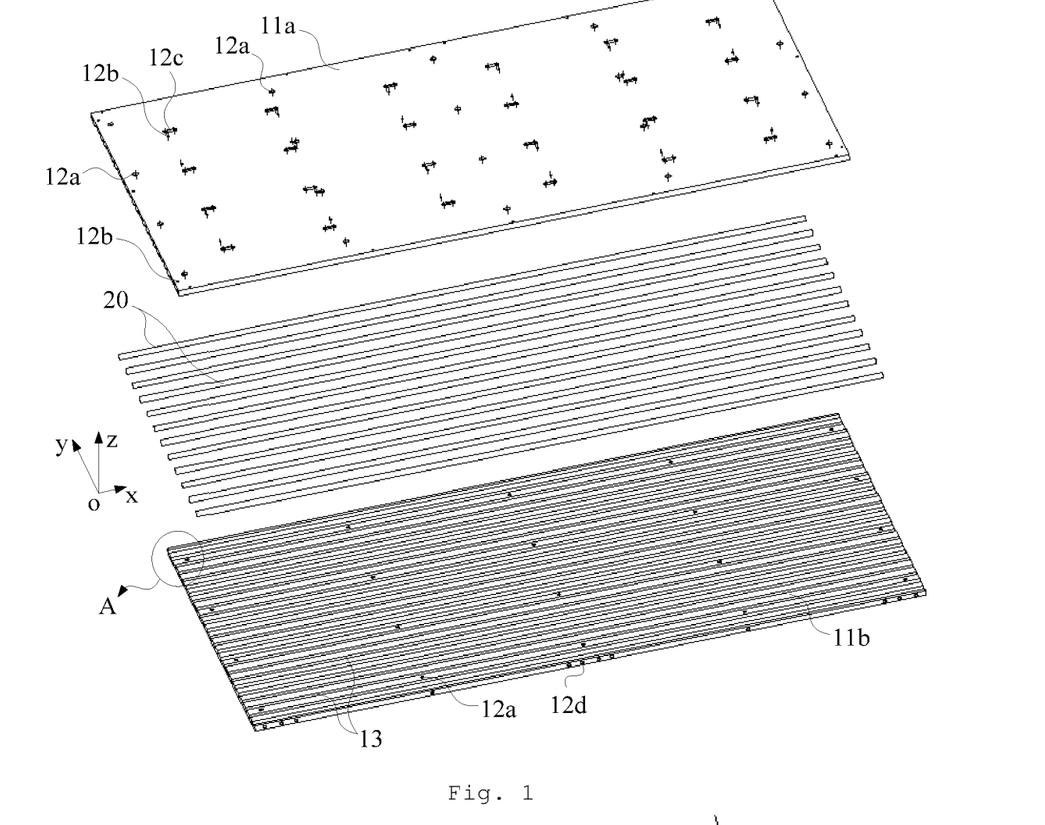
FIG. 1 is an exploded structural view of a first backplane, a first heat sink, and a second backplane in an embodiment of a display device according to the present disclosure.
Figure 2:
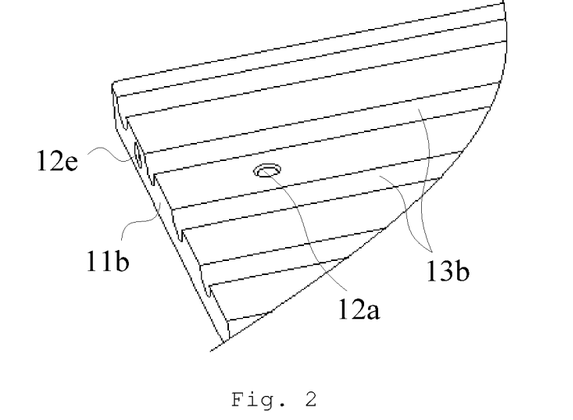
FIG. 2 is a partially enlarged schematic view of a partial structure of the second backplane on one side proximate to the first heat sink, which corresponds to a mark A in FIG. 1.
Figure 3:
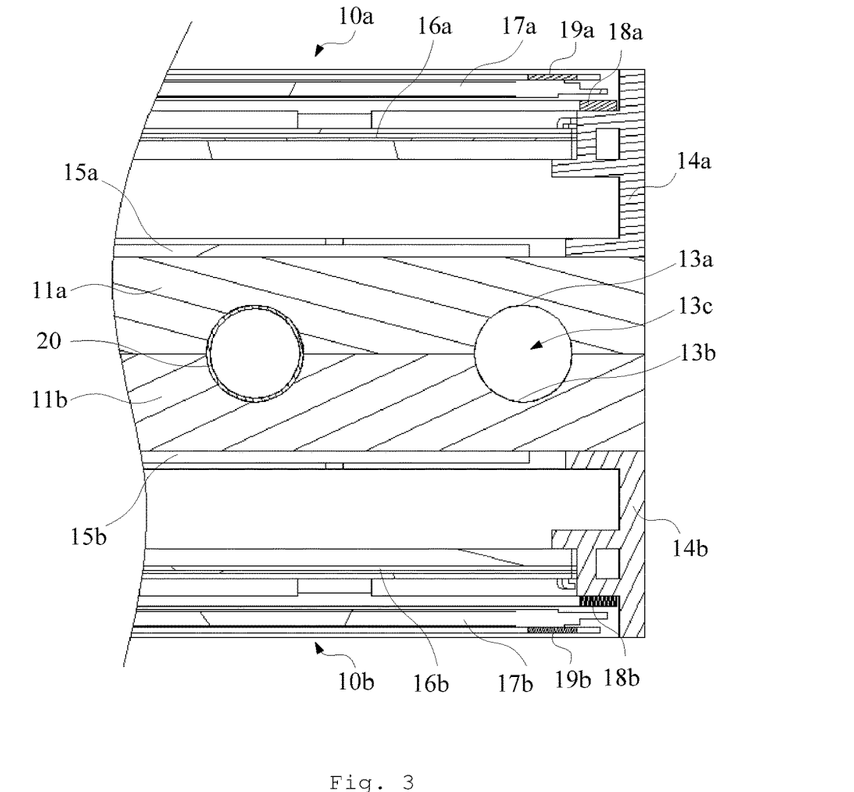
FIG. 3 is a partial schematic view of a cross-sectional structure taken along a direction perpendicular to a length direction of an elongated member in an embodiment of a display device according to the present disclosure.

FIG. 1 is an exploded structural view of a first backplane, a first heat sink, and a second backplane in an embodiment of a display device according to the present disclosure. FIG. 2 is a partially enlarged schematic view of a partial structure of the second backplane on one side proximate to the first heat sink, which corresponds to a mark A in FIG. 1. FIG. 3 is a partial schematic view of a cross-sectional structure taken along a direction perpendicular to a length direction of an elongated member in an embodiment of a display device according to the present disclosure.

Referring to FIGS. 1-3, in some embodiments, the display device includes: a first display module 10a, a second display module 10b, and a first heat sink. The first display module 10a has a first backplane 11a. The second display module 10b has a second backplane 11b located on an opposite side of the first backplane 11a. The first heat sink is located between the first backplane 11a and the second backplane 11b, and configured to radiate heat from the first backplane 11a and the second backplane 11b.

In FIG. 1, the first backplane 11a is located at the uppermost, the second backplane 11b is located at the lowermost, and the first heat sink is located between the first backplane 11a and the second backplane 11b. When the first heat sink is assembled, the first backplane 11a, the first heat sink, and the second backplane 11b may be sequentially assembled according to an arrangement order in FIG. 1. The first backplane 11a and the second backplane 11b are arranged adjacently and oppositely, so that two display sides of the first display module 10a and the second display module 10b face towards two opposite directions.

The materials of the first backplane 11a and the second backplane 11b may be materials that are likely to conduct heat, for example, metals such as aluminum and copper, or metal alloys. According to the foregoing structural form of the display module, the first backplane 11a and the second backplane 11b may be a backplane of a single display screen, an independent backplane of each of a plurality of display screens constituting a spliced screen or a common backplane of a plurality of display screens constituting a spliced screen.

In the present embodiment, the backplanes of the first display module and the second display module are arranged oppositely, and the first heat sink is disposed between the first backplane and the second backplane, so that the heat of the first backplane and the second backplane is conducted to the first heat sink to emit the heat, so as to realize heat radiation inside the first display module and the second display module, thereby improving the heat radiation effect of the display module and improving the service life of the display device.

In some embodiments, the shapes of the first display module 10a and the second display module 10b may be different or the same, and the sizes of the first display module 10a and the second display module 10b may be different or the same, so as to correspondingly satisfy the display needs on opposite sides of the display device. In some alternative embodiments, the shapes of the first display module 10a and the second display module 10b are both cuboid, with the same dimensions (such as overall length, width, and thickness), which may improve the interchangeability of the display modules, and facilitate the maintenance and replacement.

Referring to FIG. 1, in some embodiments, either of the first backplane 11a and the second backplane 11b may be provided with a plurality of functional holes, for example, connection holes 12a disposed through the surface of the backplane and configured to mate with screws for fixed connection at opposite positions of two backplanes, positioning holes 12b disposed in the surfaces of the first backplane and the second backplane on one side away from the first heat sink, and configured to mate with positioning pins for mounting and positioning the backplanes within the display module, mounting holes or mounting slots 12c disposed in the surfaces of the first backplane and the second backplane on one side away from the first heat sink and configured to mount a light source assembly, securing holes 12d disposed in lateral end surfaces of the first backplane and the second backplane and configured to secure the backplanes with other structures outside the display module.

In some embodiments, the first heat sink may include an elongated member, which may be a linear elongated member, or an elongated member in the shape of a fold line, wave, or spiral. The length of the elongated member is greater than the cross-sectional width or diameter of the elongated member. In other embodiments, the first heat sink may have a flat plate shape, and the length or width of the first heat sink with the flat plate shape is greater than the thickness of the first heat sink.

Referring to FIGS. 1-3, in some embodiments, the first heat sink includes a plurality of elongated members 20. The elongated member 20 may be a solid rod or a hollow tube made from a material that is likely to conduct heat (e.g., metals such as copper or aluminum). In some embodiments, the elongated member 20 may include a heat pipe, which can achieve a high thermal conductivity. Further, the heat pipe may include a gravity heat pipe whose wall material is metal. The gravity heat pipe may include an enclosed pipe evacuated inside, and the wall material of the pipe may be copper with a favorable thermal conductivity. A working medium such as water, acetone, or naphthalene that can be evaporated by heating is provided inside the enclosed pipe. The vacuum tube may be at least divided into an evaporation section and a condensation section along a length direction. The liquid-state working medium in the evaporation section is subjected to a phase change after absorbing heat and evaporated into a gaseous working medium. The gaseous working medium moves to the condensation section to release heat, and is phase changed into a liquid working medium. The liquid working medium can flow back to the evaporation section under the effect of gravity, thereby realizing a heat radiation cycle. In other embodiments, the heat pipe may also include other types of heat pipes, such as a wick heat pipe internally provided with a liquid-absorbing wick.

Referring to FIG. 3, in some embodiments, a plurality of first elongated grooves for accommodating the plurality of elongated members 20 are provided on one side of the first backplane 11a adjacent to the second backplane 11b, and a plurality of second elongated grooves 13b for accommodating the plurality of elongated members 20 are provided on one side of the second backplane 11b adjacent to the first backplane 11a. The plurality of elongated members 20 are respectively disposed in the plurality of first elongated grooves 13a and the plurality of second elongated grooves 13b. The plurality of first elongated grooves 13a may be disposed opposite to the plurality of second elongated grooves 13b, to enclose a plurality of accommodating cavities 13c, and the plurality of elongated members 20 are respectively located in a part or all of the accommodating cavities 13c.

For an embodiment in which the first heat sink includes one elongated member, one first elongated groove 13a for accommodating the one elongated member 20 may be provided on one side of the first backplane 11a adjacent to the second backplane 11b, and one second elongated groove 13b for accommodating the one elongated member 20 on one side of the second backplane 11b adjacent to the first backplane 11a. The one elongated member 20 is disposed in the one first elongated groove 13a and the one second elongated groove 13b. The one first elongated groove may be disposed opposite to the one second elongated groove, to enclose one accommodating cavity, and the one elongated member is located in the one accommodating cavity.

By arranging the elongated member in the first elongated groove and the second elongated groove, it is possible to fix a position of the elongated member between the first backplane and the second backplane, and make a more compact structure after combination and less occupation space. Moreover, the mated structure of the elongated member and the elongated groove is simpler, and easy to process. The accommodating cavity enclosed by arranging the first elongated groove and the second elongated groove oppositely may be sleeved outer the elongated member in a circumferential direction and at least partially in contact with a contour of the elongated member to achieve heat conduction. In order to improve the heat conduction effect between the elongated member and each of the first elongated groove and the second elongated groove, it is possible to allow that the cross-section of the inner wall of the accommodating cavity and the cross-section of the outer wall of the elongated member at a corresponding position may have the same shape, and the sizes of both satisfy a transition or interference fit relationship, so that the accommodating cavity can be closely attached to the surface of the elongated member.

In some embodiments, as shown in FIG. 1, the plurality of first elongated grooves 13a includes a plurality of first linear grooves, and the plurality of second elongated grooves 13b includes a plurality of second linear grooves in one-to-one correspondence with the plurality of first linear grooves. The plurality of second linear grooves may enclose a plurality of linear accommodating cavities with the plurality of first linear grooves. Each of the plurality of elongated members 20 has linear rod sections, which are respectively located in the plurality of linear accommodating cavities. It is convenient to process the first linear groove and the second linear groove, and it is also more convenient when the linear rod section is assembled with the first linear groove and the second linear groove.

Referring to the coordinate system in FIG. 1, each of the first backplane 11a and the second backplane 11b has four side end surfaces (respectively along the x-axis direction and the y-axis direction), and an inner surface and an outer surface that are located between the four side end surfaces and oppositely arranged (along the z-axis direction). The four side end surfaces include a first side end surface (located upstream along the x-axis direction) and a second side end surface (located downstream along the x-axis direction) respectively corresponding to a sky side and a ground side of the display device.

When the display device is in an operational state, there are four ends including an upper end, a lower end, a left end, and a right end. The sky side referred to in the present application is the upper end, and the ground side is the lower end.

A plurality of first linear grooves are located in the outer surface of the first backplane 11a, and extend from the first side end surface of the first backplane 11a to the second side end surface of the first backplane 11a. A plurality of first linear grooves are sequentially arranged in the outer surface of the first backplane 11a along the y-axis. For example, a plurality of first linear grooves are arranged in parallel and at equal intervals from the third side end surface of the first backplane 11a (located upstream along the y-axis) to the fourth side end surface of the first backplane 11a (located downstream along the y-axis).

A plurality of second linear grooves are located in the outer surface of the second backplane 11b, and extend from the first side end surface of the second backplane 11b to the second side end surface of the second backplane 11b. A plurality of second linear grooves are also sequentially arranged in the outer surface of the second backplane 11b along the y-axis, and every second linear groove may be parallel to each other with the same interval as that of the plurality of first linear grooves, so that one of the plurality of second linear grooves can be aligned with respective one of the first linear grooves.

The linear rod sections of the plurality of elongated members 20 extend from the first side end surface of the second backplane 11b to the second side end surface of the second backplane lib. The linear rod sections of the elongated members 20 may be disposed in the linear accommodating cavity enclosed by each of the first linear groove and each of the second linear groove, or may be arranged in a plurality of linear accommodating cavities at intervals along the y-axis.

By extending the linear groove from the first side end surface to the second side end surface of the backplane, the elongated member may perform heat exchange with the backplane by means of the linear groove in a greater range, so as to achieve a larger area of heat radiation. By arranging a plurality of linear grooves in parallel and at the same interval in the outer surface of the backplane, it is possible to allow the heat exchange between the backplane and a plurality of elongated members to be more uniform, so that there is more balanced heat radiation of the backplane and the risk of local overheating is reduced.

In other embodiments, according to the heating difference at different locations of the backplane, a plurality of linear grooves may also be arranged not to be parallel to each other, and a plurality of adjacent linear grooves may have at least two different intervals.

Referring to FIG. 3, the inner cross-sections of each of the plurality of first linear grooves and each of the plurality of second linear grooves may be a part of a circle, and correspondingly, the outer cross-section of the linear rod section is a circle. More specifically, the inner cross-section of each of the plurality of first linear grooves and each of the plurality of second linear grooves may be a semi-circle with an equal radius, and the outer cross-section of the linear rod section is a circle having the same radius as the semi-circle. In this way, the linear rod section may be very closely attached to the first linear groove and the second linear groove. In other embodiments, the inner cross-sections of the first linear groove and the second linear groove may also be a part of an ellipse, and correspondingly, the outer cross-section of the linear rod section is an ellipse mated with the linear groove and the second linear groove.

In other embodiments, the shape of the inner cross-section of each linear groove may be different, or the shape is the same and the size is different, so that it is possible to form accommodating cavities having different shapes and/or different sizes, so as to mate with linear rod sections with outer cross-sections in different shapes and/sizes.

Referring to FIG. 3, in some embodiments, the first display module 10a may further include: a first frame, a first light source assembly 15a, a first optical film 16a, and a first liquid crystal screen 17a. The first frame is disposed on one side of the first backplane 11a away from the second backplane 11b. The first light source assembly 15a is disposed within the first frame, and connected to the first backplane 11a. The first optical film 16a is disposed within the first frame, and located on one side of the first light source assembly 15a away from the first backplane 11a. The first liquid crystal screen 17a is disposed within the first frame, and located on one side of the first optical film 16a away from the first backplane 11a.

In FIG. 3, the first frame may include a first outer frame 14a, a first middle frame 18a, and a first front frame 19a. The first liquid crystal screen 17a is disposed between the first middle frame 18a and the first front frame 19a. The first light source assembly 15a and the first optical film 16a are disposed inside the first outer frame 14a and the first middle frame 18a, so that direct-type backlight can be provided to the first liquid crystal screen 17a. The first backplane 11a may absorb the heat produced by the first light source assembly 15a, and conduct the heat to the elongated member 20.

Similarly, referring to FIG. 3, in some embodiments, the second display module 10b may further include: a second frame, a second light source assembly 15b, a second optical film 16b, and a second liquid crystal screen 17b. The second frame is disposed on one side of the second backplane 11b away from the first backplane 11a. The second light source assembly 15b is disposed within the second frame, and connected to the second backplane 11b. The second optical film 16b is disposed in the second frame, and located on one side of the second light source assembly 15b away from the second backplane 11b. The second liquid crystal screen 17b is disposed within the second frame, and located on one side of the second optical film 16b away from the second backplane 11b.

In FIG. 3, the second frame may include a second outer frame 14b, a second middle frame 18b, and a second front frame 19b. The second liquid crystal screen 17b is disposed between the second middle frame 18b and the second front frame 19b. The second light source assembly 15b and the second optical film 16b are disposed inside the second outer frame 14b and the second middle frame 18b, so that direct-type backlight can be provided to the second liquid crystal screen 17b. The second backplane 11b may absorb the heat produced by the second light source assembly 15b, and conduct the heat to the elongated member 20.

Figure 4:
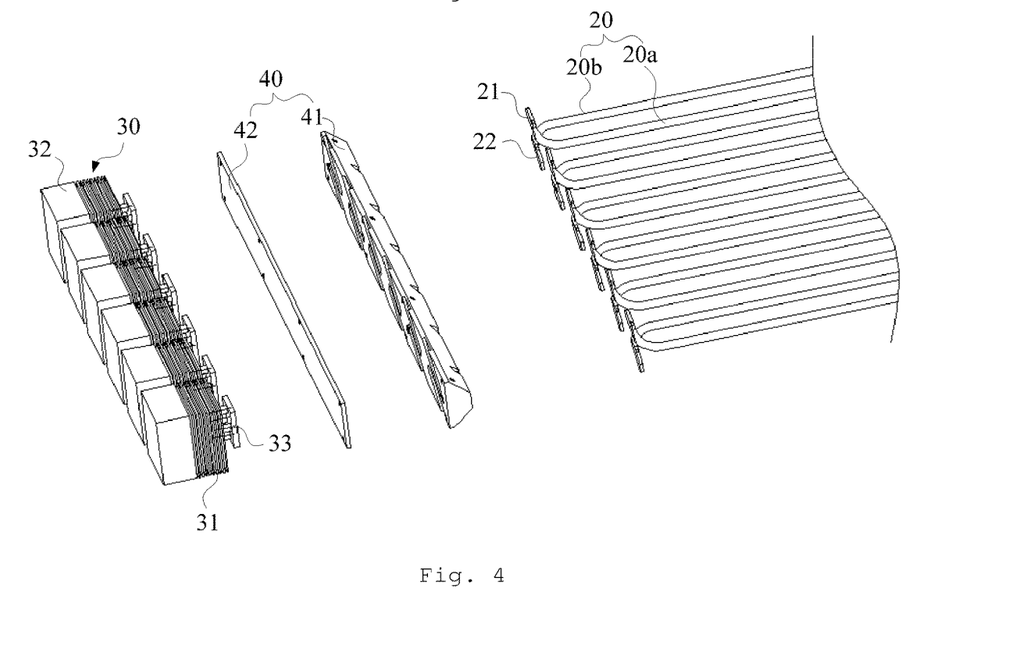
FIG. 4 is an exploded structural view of a first heat sink, a fixing base, a second heat sink, and a third heat sink in an embodiment of a display device according to the present disclosure.
Figure 5:
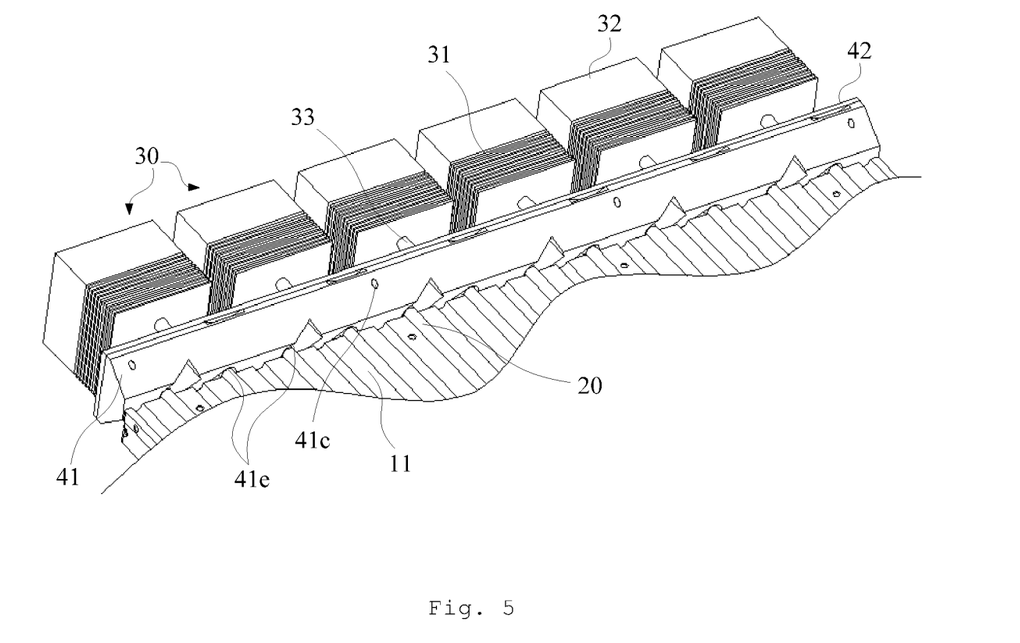
FIG. 5 is a partial schematic view of an assembled structure of a second backplane, a first heat sink, a fixing base, a second heat sink, and a third heat sink in an embodiment of a display device according to the present disclosure.
Figure 6:
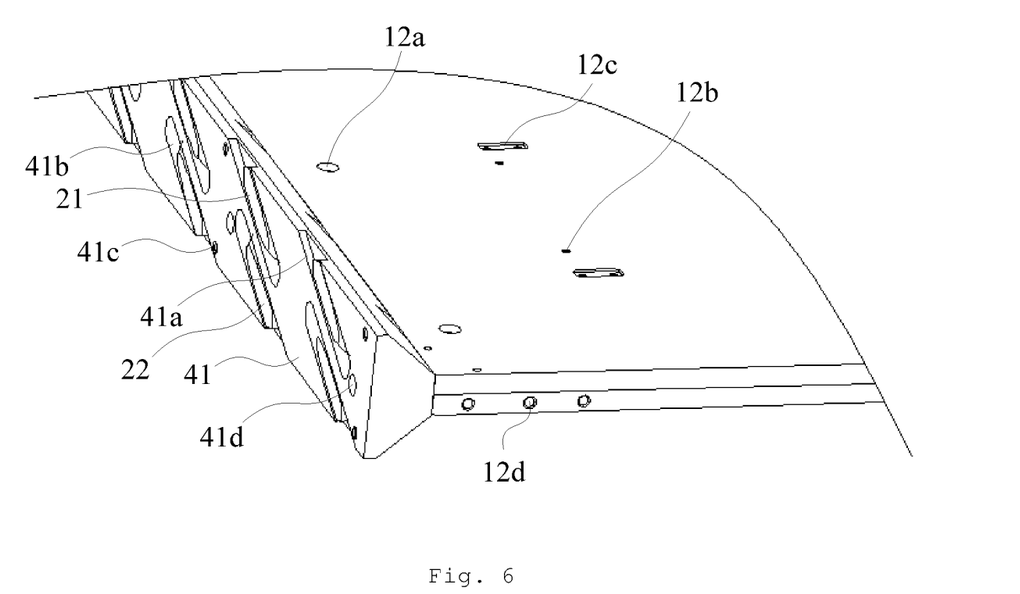
FIG. 6 is a partial schematic view of an assembled structure of a first backplane, a second backplane, a first heat sink, and a fixing base in an embodiment of a display device according to the present disclosure.

FIG. 4 is an exploded structural view of a first heat sink, a fixing base, a second heat sink, and a third heat sink in an embodiment of a display device according to the present disclosure. FIG. 5 is a partial schematic view of an assembled structure of a second backplane, a first heat sink, a fixing base, a second heat sink, and a third heat sink in an embodiment of a display device according to the present disclosure. FIG. 6 is a partial schematic view of an assembled structure of a first backplane, a second backplane, a first heat sink, and a fixing base in an embodiment of a display device according to the present disclosure.

Referring to FIGS. 4 and 5, in some embodiments, the display device further includes a second heat sink 30. In FIG. 1, each of the plurality of elongated members 20 may have an extension section extending to an exterior of the first backplane and the second backplane. The second heat sink is located on one side of the first display module and the second display module adjacent to the extension section, and connected to the extension section in thermal conduction. The elongated member 20 may conduct the heat produced by the backplanes of the first display module 10a and the second display module 10b to the second heat sink 30 for heat radiation. Here, the thermally conductive connection between the extension section and the second heat sink may be a thermally conductive connection realized by a thermal conduction effect of an intermediate member, or may also be a thermally conductive connection in a direct contact manner without an intermediate member.

The thermally conductive connection in other embodiments of the present application may be connection in direct contact, or may also be a connection through other members.

Referring to FIG. 4, in some embodiments, the second heat sink 30 may include an electrically driven thermoelectric cooler 31. The thermoelectric cooler 31 refers to a device that utilizes a thermo-electric effect of a semiconductor to produce a cooling capacity. In FIG. 4, the second heat sink includes a plurality of thermoelectric coolers 31, for example, six thermoelectric coolers. The plurality of thermoelectric coolers 31 may be arranged at intervals along an arrangement direction of the plurality of elongated members 20. The shape of the thermoelectric coolers 31 may be Cuboid-shaped or Cylinder-shaped. Each thermoelectric cooler 31 has a connection end 33 for connecting a location requiring heat radiation. The connection end 33 may have a flat structure. A plurality of metal fins may be provided outside the thermoelectric cooler 31 so as to increase the heat radiation area.

In order to improve the heat radiation efficiency, the display device may further include a plurality of third heat sinks, which are respectively connected to the plurality of thermoelectric coolers 31, for assisting the plurality of thermoelectric coolers 31 to radiate heat. The third heat sink may specifically include a first fan 32 disposed on the thermoelectric cooler 31 for air-cooling the thermoelectric cooler 31. The air inlet end of the first fan 32 is located on one side of the first fan 32 adjacent to the outer surface of the thermoelectric cooler 31 on a sky side, and the air outlet end of the first fan 32 is located on one side of the first fan 32 away from the outer surface of the thermoelectric cooler 31 on a sky side. In this way, the first fan 32 may guide hot air flow around the thermoelectric cooler 31 to the sky side, thereby preventing the hot air from affecting the display module on a ground side of the second heat sink. In other embodiments, the third heat sink may use other cooling manners such as water cooling to assist the thermoelectric cooler 31 in radiating heat.

In other embodiments, the second heat sink 30 may include a solid structural member made from a metallic material, such as a cubic or Cuboid solid metal block, and fins may be provided on the surface of the solid structural member to increase a heat radiation area. The number of the solid structural members included in the second heat sink 30 may be one or more. The first fan 32 may also be provided on the surface of the solid structural member or the fins, so as to improve the heat radiation efficiency of the solid structural member and the fins.

Referring to FIG. 4, the connection end 33 of some thermoelectric coolers 31 includes a connecting rod connected to the main body of the thermoelectric cooler 31 in thermal conduction and a flat connecting block fixed to an end of the connecting rod on one side away from the main body of the thermoelectric cooler 31. It is not likely to directly form a stable thermally conductive connection between the flat connecting block and the extension section of the elongated member. Therefore, the display device may further include a fixing base 40. The fixing base 40 is located between the plurality of thermoelectric coolers 31 and the extension section, and configured to fixedly connect the second heat sink to the plurality of elongated members. The fixing base which serves as a thermally conductive intermediate member of the second heat sink and the first heat sink, can provide a stable and reliable thermally conductive connection, so that the heat of the backplane of the display module may be radiated outwards via the first heat sink, the fixing base, and the second heat sink, thereby improving the heat radiation of the display module.

Referring to FIGS. 4 and 5, in some embodiments, the fixing base 40 includes a base 41 and a cover 42. The base 41 has a plurality of plugging holes 41e and a plurality of limiting slots communicating with the plurality of plugging holes 41e inside the base 41 respectively. The extension sections of the plurality of elongated members 20 respectively pass through the plurality of plugging holes 41e, and are bent and embedded within the plurality of limiting slots. The cover plate 42 is located between the base 41 and the plurality of thermoelectric coolers 31, and fixedly connected to the plurality of thermoelectric coolers 31 and the base 41. The inner surface of the cover plate 42 may fix the bent portions of the extension sections of the plurality of elongated members in abutting manner. In this way, the bent portions of the extension sections of the elongated members 20 may be restricted within the limiting slots from mobility, thereby ensuring the stability of the thermal conductive connection and improving the thermal conductive effect. In FIG. 6, it may be seen that the bent portions 21 and 22 of two adjacent elongated members are embedded in different limiting slots respectively.

In FIG. 6, the base 41 has a first end continuously abutting against an edge of at least one of the first backplane 11a and the second backplane 11b and a second end fixedly connected to the cover plate 42. A plurality of limiting slots are located at the second end of the base 41. Referring to FIG. 5, the plurality of plugging holes are located at the first end of the base. In the direction perpendicular to the first backplane 11a, the first end of the base 41 has a width smaller than that of the second end of the base 42, which makes the cross-sectional shape of the base 41 along a direction perpendicular to the first backplane 11a is similar to a trapezoid. The inner surface of the cover plate 42 may be arranged to be closely attached to the surface of the second end of the base 41, and the orthographic projection of the cover plate 42 may coincide with the surface of the second end of the base 41. In this way, the first end of the base 41 can be adapted to the shape and small width of the first side end surfaces of the first backplane 11a and the second backplane 11b, or can also be adapted to the cover plate 42 connected to the connection end 33 of the thermoelectric cooler 31 having a large width through the second end of the base 41.

Referring to FIG. 6, in some embodiments, the surface of the first end of the base 41 and the surface of the second end of the base 41 may be parallel to the inner surface of the cover plate 42. This facilitates forming a small width by a plurality of thermoelectric coolers, fixing bases and two backplanes in a direction perpendicular to the backplane, and reduces the occupied space in the width direction. In other embodiments, the surface of the first end of the base 41 may not be parallel to the surface of the second end of the base 41 and the inner surface of the cover 42 so as to meet different installation needs.

Referring to FIGS. 1 and 4 to 6, in some embodiments, the plurality of elongated members 20 include a plurality of elongated member groups sequentially arranged along a first direction (e.g., y-axis direction or reverse direction in FIG. 1) perpendicular to the linear rod sections of the plurality of elongated members 20. Each elongated member group includes a first elongated member 20a and a second elongated member 20b arranged adjacently along the first direction. The bent portions 21 of the extension sections of the first elongated members 20a are perpendicular to the linear rod section, and extend in a direction defining an acute angle with the first backplane 11a. The bent portions 22 of the extension sections of the second elongated members 20b are perpendicular to the linear rod section, and extend in a direction opposite to the extending direction of the bent portions 21 of the extension sections of the first elongated members 20a.

In FIG. 6, the plurality of limiting slots may include a plurality of limiting slot groups sequentially arranged along the first direction corresponding to the plurality of elongated members 20. Every limiting slot group includes a first limiting slot 41a and a second limiting slot 41b arranged adjacently along the first direction. The inner contour of the first limiting slot 41a matches the outer contour of the bent portions 21 of the extension sections of the first elongated members 20a. The inner contour of the second limiting slot 41b matches the outer contour of the bent portion 22 of the extension sections of the second elongated members 20b. The orthographic projections of the first limiting slot 41a and the second limiting slot 41b in the extension plane of the first backplane may at least partially coincide, so that it is possible to reduce the width space occupied by each limiting slot group in the direction perpendicular to the first backplane, and correspondingly reduce a width dimension of the second end of the base 41. In order to facilitate the process, the bent portions of the extension sections of the first elongated member 20a and the second elongated member 20b in each elongated member group all may be parallel.

In FIG. 6, the base 41 may also be provided with a connection hole 41c for fixed connection with the cover plate 42, the connection hole may be fixedly connected to the cover plate 42 by screws or bolts. In addition, the base 41 may be fixedly connected to the first backplane 11a or the second backplane 11b. For example, in FIG. 6, the base 41 may be provided with amounting hole 41d, which is mated with the mounting hole 12e in the first backplane 11a or the second backplane 11b in FIG. 2, so as to implement fixing of the base 41 relative to the first backplane 11a or the second backplane 11b.

The above-described embodiments of the display device may be used for various electronic devices, such as light boxes, signage and the like for outdoor display.

Figure 7:
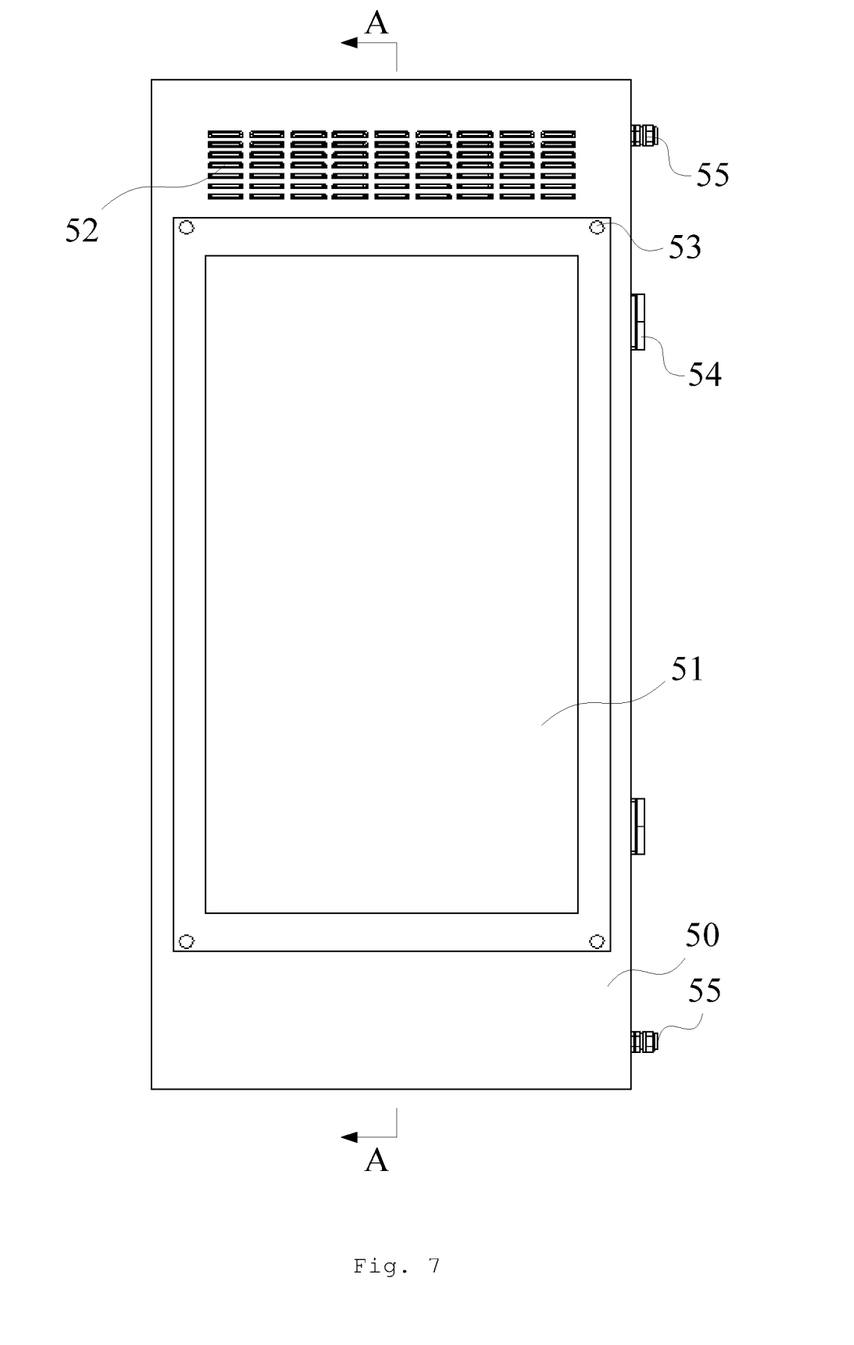
FIG. 7 is a schematic view of an external structure in an embodiment of an electronic device according to the present disclosure.
Figure 8:
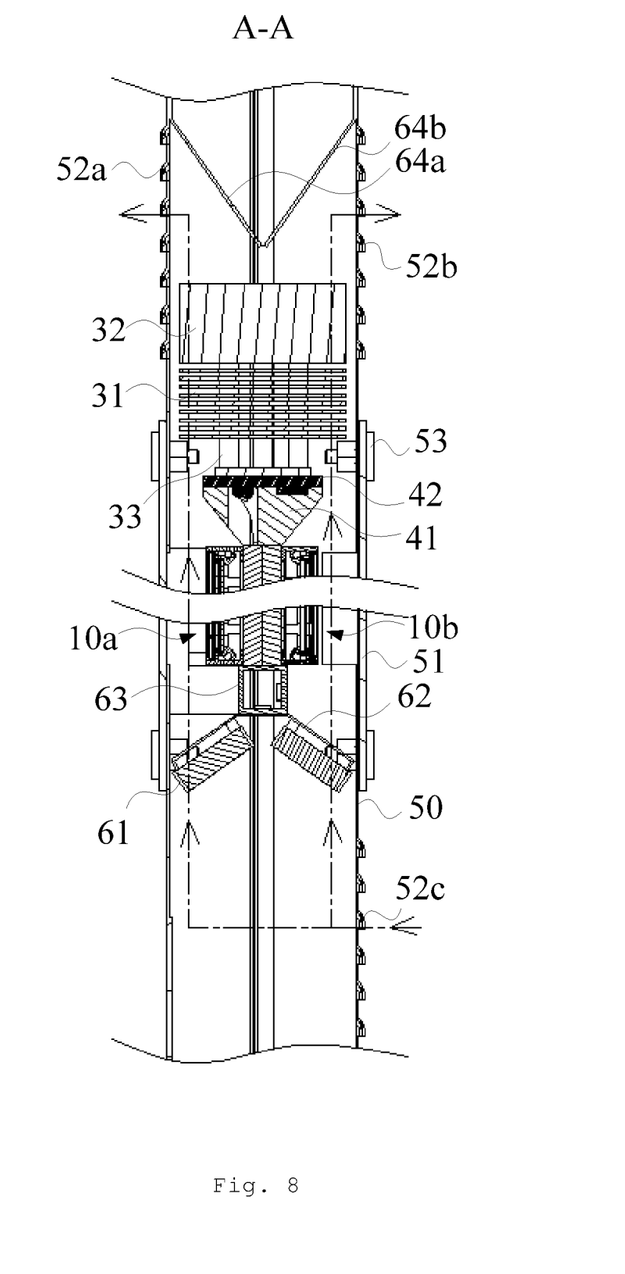
FIG. 8 is a partial schematic view from an air outlet on a sky side to an air inlet on a ground side in an AA section in FIG. 7.
Figure 9:
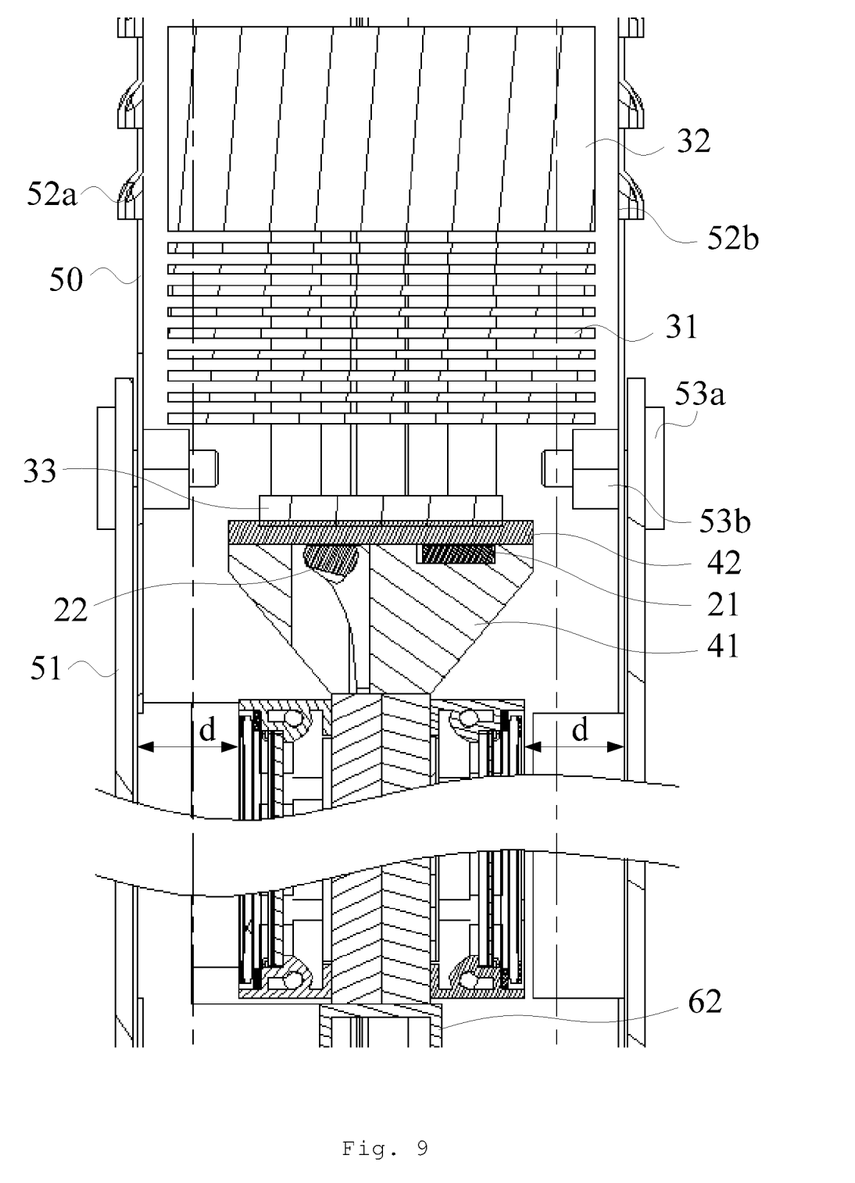
FIG. 9 is a partially enlarged schematic view of an assembled structure of a display device within a housing of the device in FIG. 8.

FIG. 7 is a schematic view of an external structure in an embodiment of an electronic device according to the present disclosure. FIG. 8 is a partial schematic view from an air outlet on a sky side to an air inlet on a ground side in an AA section in FIG. 7. FIG. 9 is a partially enlarged schematic view of an assembled structure of a display device within a housing of the device in FIG. 8.

Referring to FIGS. 7 and 8, in some embodiments, the electronic device includes: the display device in the foregoing embodiments, a device housing 50 and a second fan 61. The device housing 50 is enclosed outside the display device. The second fan 61 is disposed within the device housing 50, and located on the ground side of the first display module 10a and the second display module 10b of the display device. The second heat sink of the display device is located on the sky side of the first display module 10a and the second display module 10b. In FIG. 8, the device housing 50 may be internally provided with a support frame 63, such that the display device is mounted and supported on the sky side of the support frame 63. The second fan 61 may be fixedly connected below the support frame 63 through a fan mounting frame 62. The support frame 63 may be fixedly connected to the device housing 50, and its cross-section may be a hollow rectangle.

In FIG. 8, the plurality of thermoelectric coolers 31 included in the second heat sink and the first fan 32 included in the third heat sink are located on the sky side of the first display module 10a and the second display module 10b. The second fan 61 may guide the air flow having a relatively low temperature within the device housing 50 to flow through the display device so as to take away the heat produced by the display device.

In FIGS. 7 and 9, transparent windows 51 are provided at positions of side walls of the device housing 50 corresponding to the first display module 10a and the second display module 10b of the display device, with a certain distance maintained between the transparent window 51 and each of the first display module 10a and the second display module 10b of the display device, so as to ensure that there is ventilation gaps d therebetween. In some embodiments, the ventilation gaps on both sides are equal, so that there is more uniform air flow passing through the first display module 10a and the second display module 10b, thereby avoiding an excessively high local temperature.

The second fan 61 may guide the air flow through the ventilation gaps d and carry away the heat in the surface of the liquid crystal screen of the display module. The transparent window 51 may include a transparent glass or plastic plate fixed on the opening opened on the device housing 50 through the connecting piece 53. In FIG. 9, the connecting piece 53 includes a bolt 53a and a nut 53b. The transparent window 51 may be made from toughened glass, which has a certain strength whilst transmitting light, thereby preventing the transparent window 51 from being damage under impact and affecting the components inside the device housing 50.

Referring to FIG. 8, the fan mounting frame 62 may be mounted with two groups of second fans 61, which are respectively configured for the air cooling effect of the respective display screens of the first display module 10a and the second display module 10b. Either group of second fans 61 may include at least one second fan 61. The intermediate section of the fan mounting frame 62 may be fixedly connected to the lower surface of the support frame 63, and the overhanging sections located on both sides of the intermediate section are fixedly connected to the two groups of second fans 61 respectively, and extend obliquely toward the ground side. Correspondingly, the blast ranges of the two groups of second fans 61 are respectively directed to the ventilation gaps between the corresponding display module and the transparent window.

In FIG. 8, the device housing 50 may further include: an air inlet 52c, a first air outlet 52a, and a second air outlet 52b. One air inlet 52c is opened in a side wall of the device housing 50 on the same side as the transparent window 51 corresponding to one of the first display module 10a and the second display module 10b, and located on the ground side of the second fan 51. Each of the air inlet 52c, the first air outlet 52a, and the second air outlet 52b may include a plurality of slits, and an arc-shaped shield may be provided on the upper edge of the outer wall of the device housing 50 corresponding to each slit, so as to prevent dust or rain outside the device housing 50 from entering an interior of the device housing 50. In addition, the device housing 50 may also be provided with an interface 55 for connecting a power supply.

The first air outlet 52a and the second air outlet 52b are respectively opened on the first side wall and the second side wall of the device housing 50 opposite and parallel to each other, and located on the sky side of the first display module 10a and the second display module 10b. The first side wall is on the same side as the transparent window corresponding to the first display module 10a, and the second side wall is on the same side as the transparent window corresponding to the second display module 10b. The end of the second heat sink located on the sky side is not higher than the lowest position of the first air outlet 52a and the second air outlet 52b on the ground side respectively.

Referring to the air flow direction indicated by the arrow in FIG. 8, under the drive of the second fan 61, the air outside the device housing 50 may enter an interior of the device housing 50 from the air inlet 52c, and then be exhausted outwards from the first air outlet 52a and the second air outlet 52b via the second fan 51, the ventilation gap d and a lateral side of the second heat sink. In this way, cold air from the outside may first take away the heat on the surface of the display screen of the display module upward through the ventilation gap, so as to achieve the air-cooling effect of the display screen, and at the same time air-cooling the second heat sink that absorbs heat from the first heat sink. During the process that the second heat sink is air-cooled, the second heat sink may continuously receive the heat conducted from the backplane of the display module via the first heat sink, thereby achieving effective heat radiation of the backplane.

Referring to FIG. 8, in some embodiments, the electronic device may further include an air deflector structure. The air deflector structure is located on one side of the device housing adjacent to the first air outlet and/or the second air outlet, and configured to guide the air flow within the device housing to be discharged outwards via the first air outlet and/or the second air outlet. In FIG. 8, the first air deflector 64a and the second air deflector 64b are respectively disposed inside the first air outlet 52a and the second air outlet 52b within the device housing 50, and both located on the sky side of the second heat sink, and configured to guide the air flow within the device housing 50 to be exhausted outwards via the first air outlet 64a and the second air outlet 64b respectively.

The first end of the first air deflector 64a located on the sky side is connected to the inner wall surface of the first side wall, and the first end of the first air deflector 64a is higher than the highest position of the first air outlet 52a on the sky side. The second end of the first air deflector 64a located on the ground side is disposed at a center position between the first side wall and the second side wall. The first end of the second air deflector 64b located on the sky side is connected to the inner wall surface of the second side wall, and the first end of the second air deflector 64b is higher than the highest position of the second air outlet 52b on the sky side. The second end of the second air deflector 64b located on the ground side is disposed at a center position between the first side wall and the second side wall. In this way, two streams of air flows coming from the ground side and passing through the two ventilation gaps respectively may be exhausted to the first air outlet and the second air outlet after collision with the surfaces of the first air deflector and the second air deflector, thereby achieving a reasonable path of a cooling air flow. With reference to the foregoing double-screen embodiments, the present disclosure also proposes embodiments of the display device including a single screen. Compared with the above-described double-screen embodiment, the display device of the present embodiment includes: a first display module and a plurality of elongated members. The first display module has a first backplane including a plurality of first linear grooves. The plurality of elongated members are located on the outer surface of the first backplane away from the display side of the first display module, and have linear rod sections. The linear rod sections of the plurality of elongated members are respectively located within a part or all of the plurality of first linear grooves.

Further, the first backplane may have four side end surfaces, the outer surface between the four side end surfaces, and an inner surface arranged opposite to the outer surface. The four side end surfaces include a first side end surface and a second side end surface respectively corresponding to the sky side and the ground side of the display device, the plurality of first linear grooves are parallel to each other with the same interval, and extend from the first side end surface of the first backplane to the second side end surface of the first backplane. The linear rod sections of the plurality of elongated members extend from the first side end surface of the first backplane to the second side end surface of the first backplane.

In the plurality of first linear grooves, the inner cross-section of each first linear groove may be a semi-circle having an equal radius, and the outer cross-sections of the linear rod sections of the plurality of elongated members include a circle having the same radius as the semi-circle. Moreover, each of the plurality of elongated members may include a gravity heat pipe with a wall material of copper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display device, comprising:
    a first display module having a first backplane;
    a second display module having a second backplane located on an opposite side of the first backplane; and
    a first heat sink located between the first backplane and the second backplane, and configured to radiate heat from the first backplane and the second backplane,
    wherein the first heat sink comprises one elongated member or a plurality of elongated members;
    the first backplane has one first elongated groove provided on one side of the first backplane adjacent to the second backplane, and configured to accommodate the one elongated member;
    the second backplane has one second elongated groove provided on one side of the second backplane adjacent to the first backplane, and configured to accommodate the one elongated member; and
    the one elongated member is disposed in at least one of the one first elongated groove and the one second elongated groove; or
    the first backplane has a plurality of first elongated grooves provided on one side of the first backplane adjacent to the second backplane, and configured to accommodate a plurality of elongated member;
    the second backplane has a plurality of second elongated grooves provided on one side of the second backplane adjacent to the first backplane, and configured to accommodate the plurality of elongated members; and
    the plurality of elongated members are respectively disposed in the plurality of first elongated grooves and the plurality of second elongated grooves.

2. The display device according to claim 1, wherein the plurality of first elongated grooves are disposed opposite to the plurality of second elongated grooves, so as to enclose a plurality of accommodating cavities, and the plurality of elongated members are respectively located in a part or all of the plurality of accommodating cavities.

3. The display device according to claim 2, wherein the plurality of first elongated grooves comprise a plurality of first linear grooves, and the plurality of second elongated grooves comprise a plurality of second linear grooves one-to-one correspondence with the plurality of first linear grooves, so as to enclose a plurality of linear accommodating cavities with the plurality of first linear grooves, and each of the plurality of elongated members has a linear rod section respectively located in the plurality of linear accommodating cavities;
    the plurality of first linear grooves are parallel to each other with a same interval; and
    the plurality of second linear grooves are parallel to each other with a same interval.

4. The display device according to claim 3, wherein each of the first backplane and the second backplane has four side end surfaces, and an inner surface and an outer surface which are located between the four side end surfaces and oppositely arranged, the four side end surfaces comprise a first side end surface and a second side end surface respectively corresponding to a sky side and a ground side of the display device, the plurality of first linear grooves are located in an outer surface of the first backplane, and extend from a first side end surface of the first backplane to a second side end surface of the first backplane, and the plurality of second linear grooves are located in an outer surface of the second backplane, and extend from a first side end surface of the second backplane to a second side end surface of the second backplane, and linear rod sections of the plurality of elongated members extend from the first side end surface of the second backplane to the second side end surface of the second backplane.

5. The display device according to claim 3, wherein each of the plurality of first linear grooves and each of the plurality of second linear grooves have an inner cross-section which is a part of a circle or a part of an ellipse, and the linear rod sections have an outer cross-section which is a circle or an ellipse;
    each of the plurality of first linear grooves and each of the plurality of second linear grooves have an inner cross-section which is a semi-circle having an equal radius; and
    the linear rod sections have an outer cross-section which is a circle having the same radius as the semi-circle.

6. The display device according to claim 2, wherein each of the plurality of elongated members has an extension section extending to an exterior of the first backplane and the second backplane, and the display device further comprises:
    a second heat sink located on one side of the first display module and the second display module adjacent to the extension section, and connected to the extension section in thermal conduction; and
    the second heat sink comprises a plurality of thermoelectric coolers.

7. The display device according to claim 6, wherein the display device further comprises:
    a fixing base located between the plurality of thermoelectric coolers and the extension section, and configured to fixedly connect the second heat sink to the plurality of elongated members;
    the fixing base comprises:
    a base having a plurality of plugging holes and a plurality of limiting slots respectively communicating with the plurality of plugging holes inside the base; and
    a cover plate located between the base and the plurality of thermoelectric coolers, and fixedly connected to the plurality of thermoelectric coolers and the base;
    wherein extension sections of the plurality of elongated members respectively pass through the plurality of plugging holes, and are bent and embedded in the plurality of limiting slots, and an inner surface of the cover plate is configured to fix bent portions of the extension sections of the plurality of elongated members in abutting manner.

8. The display device according to claim 7, wherein the base has a first end continuously abutting an edge of at least one of the first backplane and the second backplane and a second end fixedly connected to the cover plate, the plurality of limiting slots are located at the second end of the base, the plurality of plugging holes are located at the first end of the base, a width of the first end of the base is less than that of the second end of the base in a direction perpendicular to the first backplane; an inner surface of the cover plate is closely attached to a surface of the second end of the base, and an orthographic projection of the cover plate is coincident with the surface of the second end of the base; a surface of the first end of the base is parallel to the inner surface of the cover plate, and the surface of the second end of the base is parallel to the inner surface of the cover plate.

9. The display device according to claim 7, wherein the plurality of elongated members comprise a plurality of elongated member groups sequentially arranged along a first direction perpendicular to linear rod sections of the plurality of elongated members, each of the elongated member groups comprises a first elongated member and a second elongated member arranged adjacently along the first direction, and a bent portion of an extension section of the first elongated member is perpendicular relative to a linear rod section of the first elongated member and extends in a direction defining an acute angle with the first backplane, and a bent portion of an extension section of the second elongated member is perpendicular relative to a linear rod section of the second elongated member, and extends in a direction opposite to the extension direction of the bent portion of the extension section of the first elongated member;
    the plurality of limiting slots comprises a plurality of limiting slot groups arranged sequentially along the first direction, and each of the limiting slot groups comprises a first limiting slot and a second limiting slot arranged adjacently along the first direction, an inner contour of the first limiting slot matches an outer contour of the bent portion of the extension section of the first elongated member, an inner contour of the second limiting slot matches an outer contour of the bent portion of the extension section of the second elongated member, and orthographic projections of the first limiting slot and the second limiting slot in an extension plane of the first backplane at least partially coincide with each other; all of the bent portion of the extension section of the first elongated member and the second elongated member in each elongated member group are parallel.

10. The display device according to claim 6, further comprising:
    a plurality of third heat sinks respectively connected to the plurality of thermoelectric coolers, and configured to assist the plurality of thermoelectric coolers to radiate heat;
    at least one of the plurality of third heat sinks comprises:
    a first fan disposed on a thermoelectric cooler, wherein an air inlet end of the first fan is located on one side of the first fan adjacent to an outer surface of the thermoelectric cooler on a sky side, an air outlet end of the first fan is located on one side of the first fan away from an outer surface of the thermoelectric cooler on a sky side, and configured for air-cooling the thermoelectric cooler.

11. An electronic device comprising the display device according to claim 6.

12. The electronic device according to claim 11, further comprising:
    a device housing enclosed outside the display device; and
    a second fan disposed within the device housing and located on a ground side of a first display module and a second display module of the display device;
    wherein a second heat sink of the display device is located on a sky side of the first display module and the second display module; a transparent window is provided at a position of a side wall of the device housing corresponding to the first display module and the second display module of the display device; and
    a ventilation gap between the transparent window and the first display module of the display device is equal to a ventilation gap between the transparent window and the second display module of the display device.

13. The electronic device of claim 12, wherein the device housing further comprises:
- one air inlet opened on a side wall of the device housing on the same side as a transparent window corresponding to one of the first display module and the second display module, and located on a ground side of the second fan; and
- a first air outlet and a second air outlet respectively opened on a first side wall and a second side wall of the device housing opposite and parallel to each other, and located on a sky side of the first display module and the second display module, wherein the first side wall is on the same side as a transparent window corresponding to the first display module, and the second side wall is on the same side as a transparent window corresponding to the second display module;
- wherein an end of the second heat sink located on a sky side is not higher than the lowest positions of the first air outlet and the second air outlet on a ground side respectively.

14. The electronic device according to claim 13, further comprising:
- a first air deflector and a second air deflector disposed within the device housing and located on insides of the first air outlet and the second air outlet respectively, and both located on a sky side of the second heat sink, for guiding an air flow within the device housing to be exhausted outward through the first air outlet and the second air outlet respectively;
- wherein a first end of the first air deflector located on a sky side is connected to an inner wall surface of the first side wall, a first end of the first air deflector is higher than the highest position of the first air outlet on a sky side, and a second end of the first air deflector on a ground side is disposed at a center position between the first side wall and the second side wall;
- a first end of the second air deflector located on a sky side is connected to an inner wall surface of the second side wall, a first end of the second air deflector is higher than the highest position of the second air deflector on a sky side, and a second end of the second air deflector located on a ground side is disposed at the center position between the first side wall and the second side wall.

15. The display device according to claim 1, wherein the elongated member comprises a heat pipe;
- the heat pipe comprises a gravity heat pipe with a wall material of metal; and
- the gravity heat pipe has a wall material of copper.

16. An electronic device comprising the display device according to claim 1.

* * * * *